(12) United States Patent
Griffiths

(10) Patent No.: US 6,317,002 B1
(45) Date of Patent: Nov. 13, 2001

(54) CIRCUIT FOR EFFICIENTLY PRODUCING LOW-POWER RADIO FREQUENCY SIGNALS

(75) Inventor: James R. Griffiths, Londonderry, NH (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/605,715

(22) Filed: Jun. 27, 2000

(51) Int. Cl.⁷ ..................................................... H03F 3/68
(52) U.S. Cl. ........................................... 330/295; 330/302
(58) Field of Search ............................. 330/51, 295, 302, 330/306, 124 R; 455/127; 333/32, 124

(56) References Cited

U.S. PATENT DOCUMENTS

| | | |
|---|---|---|
| 3,471,796 | 10/1969 | Wright . |
| 3,769,586 * | 10/1973 | Shapiro et al. ....................... 325/157 |
| 5,163,181 | 11/1992 | Koontz . |
| 5,256,987 * | 10/1993 | Kibayashi et al. .................... 330/295 |
| 5,304,943 * | 4/1994 | Koontz .................................... 330/51 |
| 5,333,175 | 7/1994 | Ariyavisitakul et al. . |
| 5,499,395 | 3/1996 | Doi et al. . |
| 5,689,219 | 11/1997 | Piirainen . |
| 5,805,994 | 9/1998 | Perreault et al. . |
| 5,806,003 | 9/1998 | Jolma et al. . |
| 5,812,935 | 9/1998 | Kay . |
| 5,842,140 | 11/1998 | Dent et al. . |
| 6,114,911 * | 9/2000 | Iwai et al. ............................. 330/295 |
| 6,121,841 * | 9/2000 | Salzuno ................................. 330/285 |

* cited by examiner

*Primary Examiner*—Robert Pascal
*Assistant Examiner*—Henry Choe
(74) *Attorney, Agent, or Firm*—Connolly Bove Lodge & Hutz

(57) ABSTRACT

A multiple power low power radio frequency amplifier. A first transistor amplifies a radio frequency signal at a substantially peak efficiency. The amplified signal is fed to a first impedance matching network. A second transistor receives the radio frequency signal and amplifies the signal at peak efficiency. The second transistor amplifier is connected to a second impedance matching network. A control circuit selectively applies a signal to be amplified to each of the transistors. One or more of the transistors may be enabled to amplify the radio frequency at the transistors peak operating efficiency independent of whether the other of the transistors is enabled to amplify the signal.

14 Claims, 4 Drawing Sheets

CIRCUIT FOR EFFICIENTLY PRODUCING LOW-POWER RADIO FREQUENCY SIGNALS

The present invention relates to the low-power radio frequency communications art. Specifically, a power amplifier is disclosed which can provide multiple levels of modulated radio frequency signals at peak efficiency.

Cellular telephone technology requires the efficient generation and transmission of radio frequency signals in order to conserve battery power. A backed off power transmission mode has been implemented in the cellular telephone art so that the transmit power can be reduced when signal levels received at the base station are adequate using low power. Further, a reduced transmit power by the cellular telephone is necessary when operating near the base station to avoid overloading the base station receive circuit.

The use of multiple power levels in cellular telephone transmitting circuits is complicated by the fact that the active amplification devices, typically bipolar transistors, provide a peak efficiency at a single output power level. As the power is reduced the transistor efficiency dramatically decreases. Thus, under full power conditions, the power output transistors may operate close to 50% efficiency, their maximum, and in a backed-off power mode, the efficiency may drop to 10% or less.

The approach to provide multiple transmit power levels has been to operate the output transistors at different input signal drive and bias levels. When varying the bias or drive levels, the output impedance value remains for full power operations. At low power operations, the impedance is thus not optimal for reduced power operations and maximum efficiency. Accordingly, power transfer from the power output transistors to the antenna is not optimum, further reducing the net radio frequency power efficiency for the output transistors.

SUMMARY OF THE INVENTION

The present invention provides a circuit for generating multiple levels of low-power radio frequency signals. A plurality of amplifying transistors are connected to amplify a common radio frequency signal. Multiple output power levels are selectively obtained by selectively applying the signal for amplification to one or more of the transistor input terminals. Each of the transistors has a matching network connected to a single output terminal. The matching networks provide a substantially constant impedance to each collector when any number of the transistors are selected to amplify the signal. Each transistor may be operated at its maximum power efficiency generation level when selected for amplifying the input signal, thus efficiently producing a radio frequency signal for any selected power level.

DESCRIPTION OF THE PREFERRED EMBODIMENT

Figure 1:
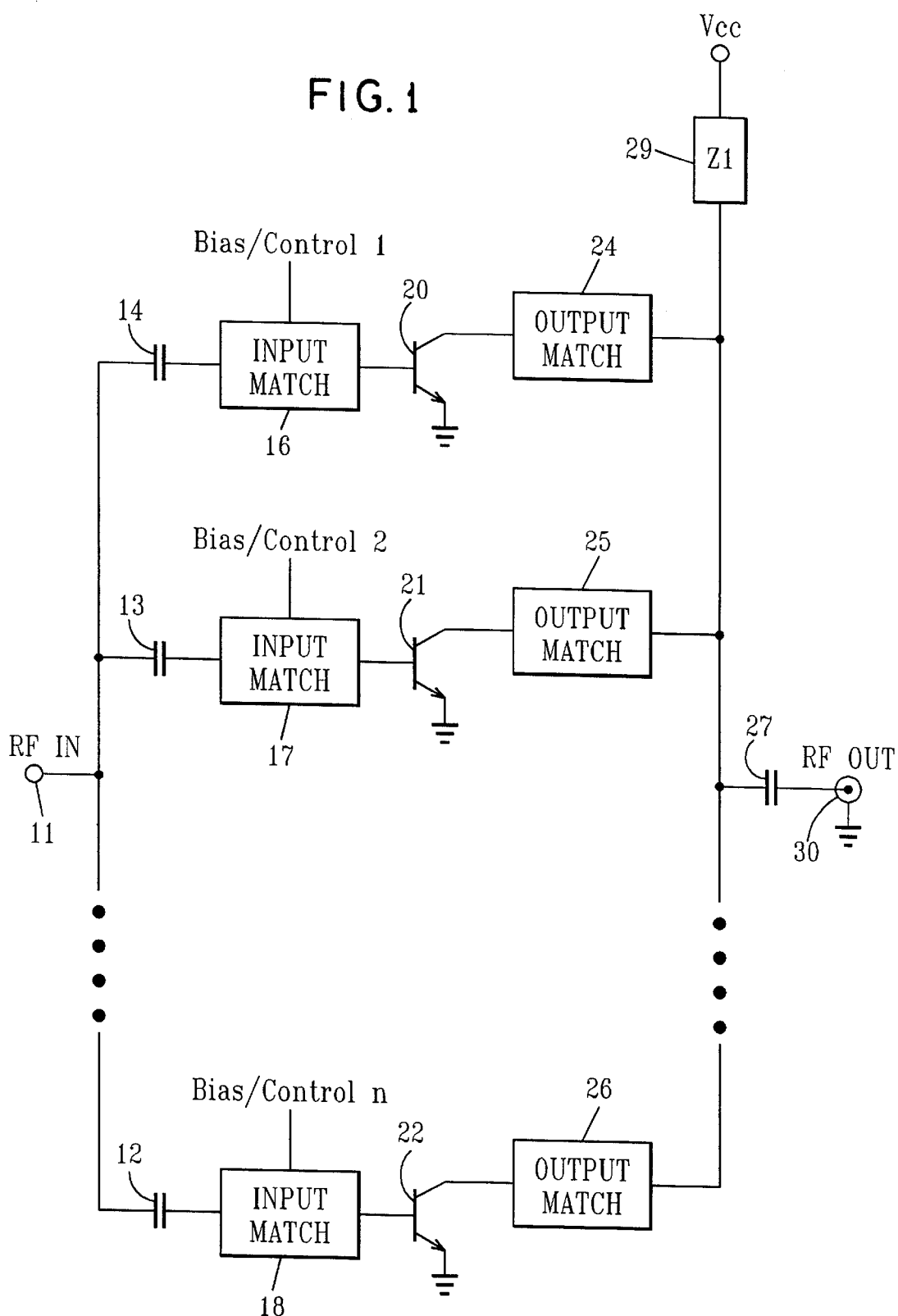
FIG. 1 is a schematic drawing illustrating a power amplifier which produces multiple power levels of a radio frequency signal.

FIG. 1 is a general view of a circuit in accordance with the invention providing for multiple levels of radio frequency output power at the selection of the user. In the illustration shown, radio frequency amplifications sections are shown which can produce a combined output power to a output terminal 30. A common radio frequency signal to be amplified is applied to terminal 11, and may be selectively applied to the input of each of transistors 20, 21 and 22. The level of output power is controlled by supplying the input signal to one or more of the amplifying transistors 20, 21 and 22 depending on the desired output level.

Power selection is controlled through bias control circuits 16, 17 and 18. Depending on the state of the bias control circuits 16–18, the radio frequency signals to be amplified is applied to one or more of transistors 20–22. Input capacitors 12–14 provide an effective DC isolation between control voltages generated by each of the bias control circuits 16–18.

Each of the amplifying transistors 20, 21 and 22 is connected to an output matching network 24, 25 and 26. The signals from the output matching networks are combined to provide an output signal which is available through DC blocking capacitor 27 to output terminal 30. A radio frequency choke impedance 29 permits an operating voltage VCC to be applied between the collectors and emitters of transistors 20–22 while isolating the source of operating voltage supply from radio frequency signals.

The output matching networks 24, 25 and 26 are designed so that each of the transistors 20–22 see an impedance match with the antenna connected across output terminal 30. The output matching networks 24 and 26 are designed, so that when one or more adjacent transistors are placed in a non-amplification state, the load impedance seen by the transistors remaining in the ON amplification state remains essentially the same. In this way, power losses due to impedance mismatches between a source, represented by a collector of a connected transistor 20–22, and the antenna impedance, remains substantially the same for all selected levels of output power.

Figure 2:
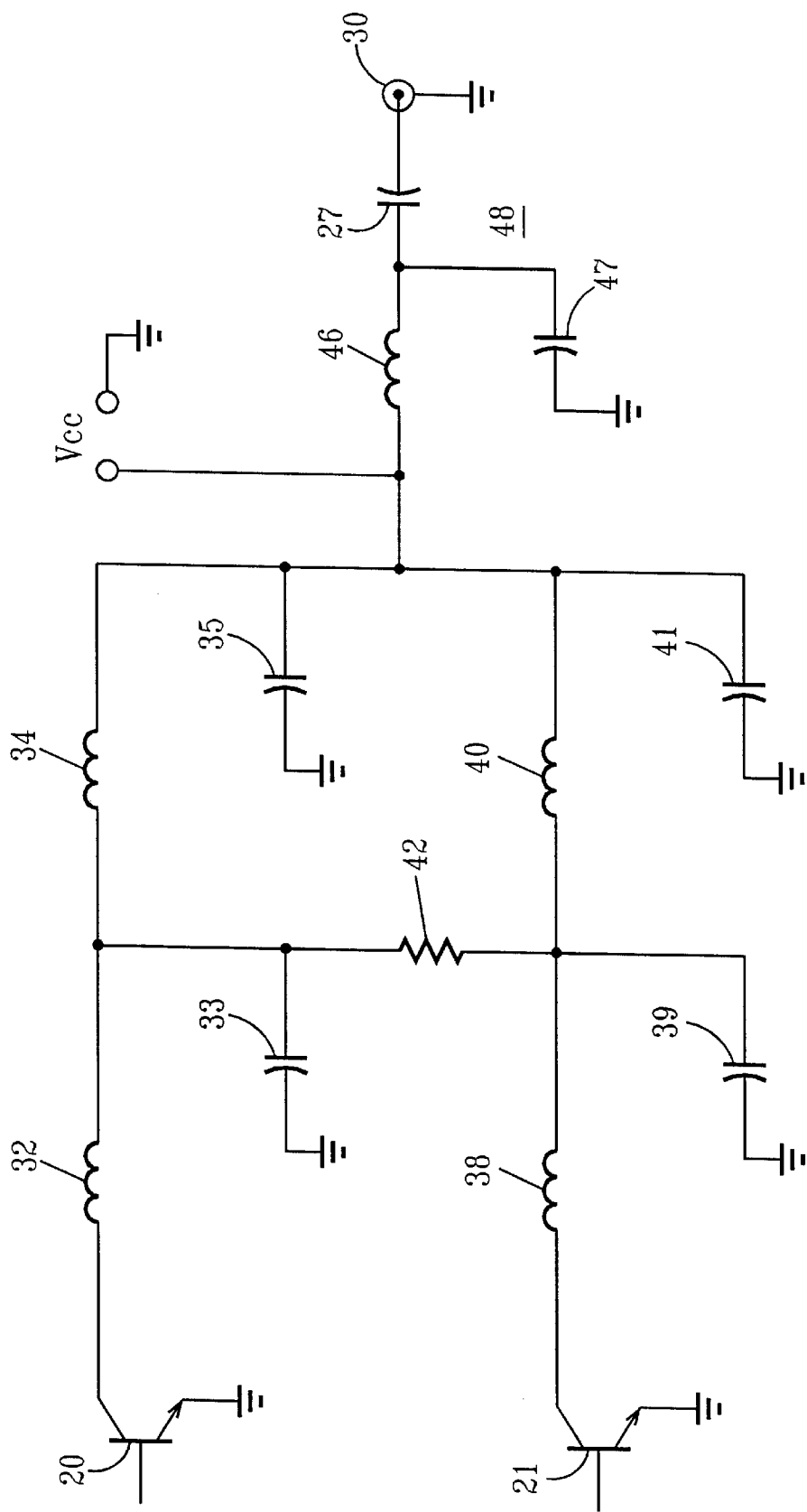
FIG. 2 illustrates a preferred embodiment of the invention wherein two transistors are utilized to generate two power levels.

In the cellular telephone application, the foregoing circuit may be implemented using two power amplification transistors, 20 and 21. As cellular telephone transmitters operate at two output power levels, a full power and backed-off power level, a circuit shown in FIG. 2 may be implemented. Referring now to FIG. 2, a power output amplification circuit is shown which provides two levels of output power. The power output transistors 20 and 21 have a matching network connected across their collector emitter circuits a matching network. The matching network for each transistor 20, 21 includes a first LC section having an inductor 32 and capacitor 33, and a second LC section having an inductor 34 and capacitor 35. A similar matching network comprising a first LC section having inductor 38 and capacitor 39, and second LC section having an inductor 40 and capacitor 41, match the output impedance of transistor 21 to an antenna load impedance connected to terminal 30.

A second matching network, for matching the composite impedance presented at the output of each of matching networks 24 and 25 consists of a single LC section, comprising inductor 46 and capacitor 47.

A decoupling element, represented by resistor 42, is connected between the junctions of the first and second LC sections of the matching network 24, with the junction of the LC sections of the matching network 25. Decoupling resistor 42 reduces the change of impedance seen by transistor 20, when transistor 21 is placed in the non-amplifying OFF state. By selecting the decoupling element to be approximately 150 ohms, a transmitter operating in the backed off mode in the 800 MHZ to one giga HZ frequency range will produce only a minimal shift in load impedance on the transistor 21 when transistor 22 is rendered non-amplifying. When both transistors are rendered in the amplifying state, they produce substantially the same output radio frequency signal level, and substantially zero current flows through the decoupling element 42.

Figure 3:
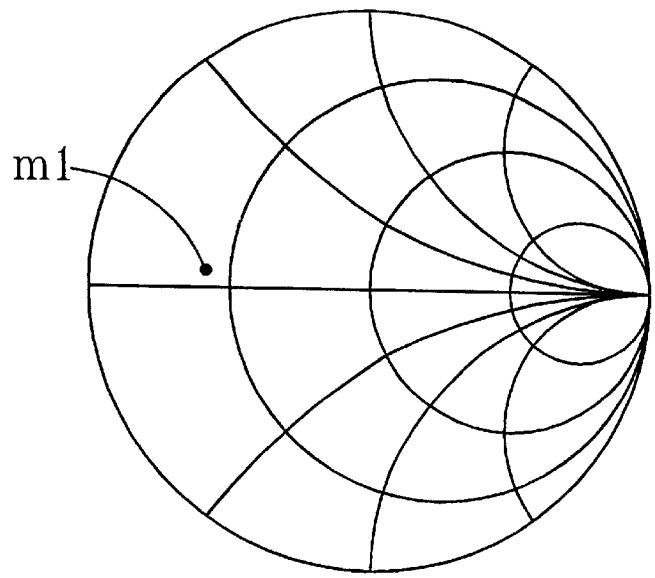
FIG. 3 is a Smith-chart representation of the output impedance for the amplifier in a full power mode.
Figure 4:
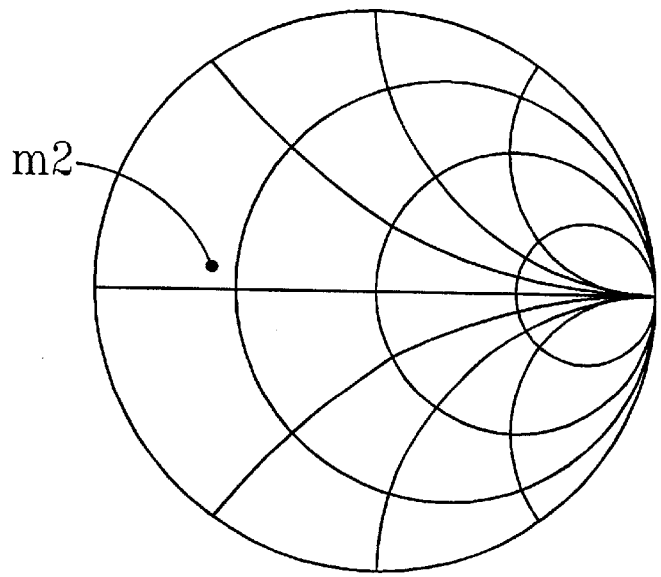
FIG. 4 is a Smith-chart representation of the output impedance of the amplifier in a backed-off mode of operation.

The minimal change of impedance, seen by transistor 20 when transistor 21 changes from the amplifying to non-amplifying state, is represented in FIGS. 3 and 4. FIGS. 3 and 4 are Smith chart representations of the output impedance seen by transistor 20 for both the high power and low power level of operation. As can be seen in FIG. 3, when transistors 20 and 21 are in the amplifying state, an impedance M1 is generated at the collector of transistor 20, as well as the collector of transistor 21 (they having identical matching networks and impedances connected to the matching networks). The impedance M1 in the condition where both transistors are amplifying is: 0.254+J0.052. When transistor 21 is rendered in the non-amplification state, the impedance shifts only a minor amount as represented by M2 on the Smith chart FIG. 4 to: 0.245+J0.055. As will be evident to those skilled in the art, the total shift in impedance causes only a minimal mismatch when the transistors are operated in the low power mode preserving the transistor amplification efficiencies between high and low power output levels.

An output impedance matching section comprising a single LC section, with inductor 46 and capacitor 47, provides an additional impedance step for the device, so that the impedance looking from the antenna connected to output terminals 30 is matched closely to the impedance seen at the output terminals of matching networks 24 and 25.

Figure 5:
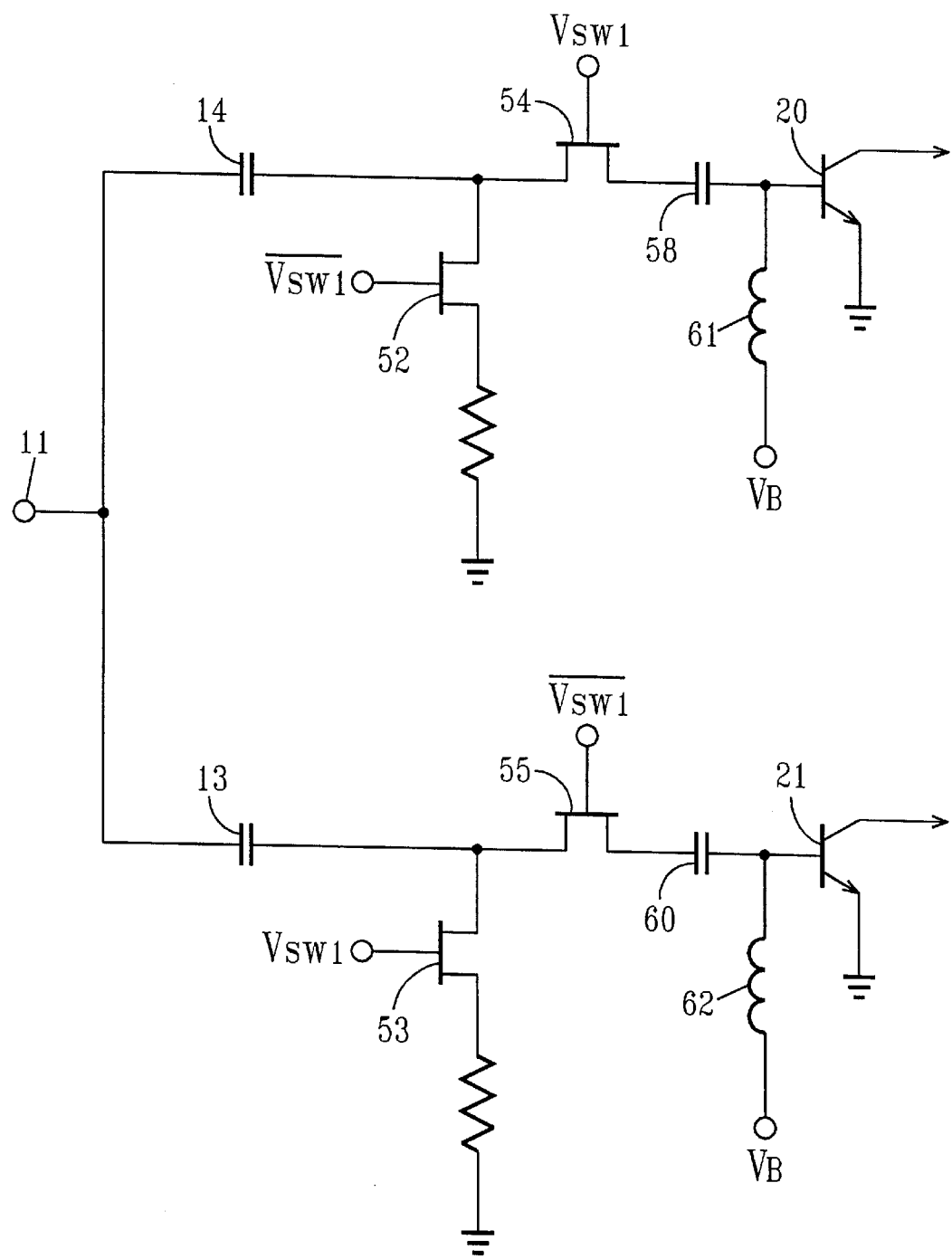
FIG. 5 is an illustration of one embodiment of a circuit for controlling the level of radio frequency power generation.

A bias control circuit for each of the amplification transistors 20 and 21 as shown more particularly in FIG. 5. Referring now to FIG. 5, the first and second amplifying transistors 20 and 21 have base connections which are connected to inductors 61 and 62. Inductors 61 and 62 provide a radio frequency choke connecting the base of the transistors to a supply of bias voltage. Transistors 20 and 21 are biased into their optimized power amplification level.

The input signal on terminal 11 is coupled via capacitors 13 and 14 to the FET switches 54, 55. FET switches 52 and 54, and 53 and 55 under control of a switching signal VSW, $\overline{VSW}$ apply the input signal to the base of each transistor 20 and 21, or to one of the transistors 20. Transistors 52, 54 and 53, 55 operate in a complementary mode, so that the signal is either attenuated or applied at substantially full amplitude to the base of transistors 20 and 21. Capacitors 58 and 60 isolate the bias voltage supply VB from FET transistors 52 and 53, so that no change in bias voltage occurs for each of the transistors 20 and 21, no matter whether the transistor is in the amplifying on state or non-amplifying off state. Maintaining the non-amplifying transistor in a biased condition further reduces the change in collector impedance which is seen by the transistor 20, when transistor 21 is in a non-amplification, OFF state.

Thus, by using the combination of features in accordance with the foregoing, an impedance match is maintained between each transistor generating radio frequency signal power and the output load impedance, which is usually an antenna, connected to terminals 30. Further each transistor when in the on-amplification state can be operated at its maximum power amplification efficiency providing for efficient utilization of battery power.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to a form disclosed herein. Also, it is intended that the appended claims be construed to include alternative embodiments.

What is claimed is:

1. A multiple power level low power radio frequency amplifier comprising:

a first transistor for amplifying a radio frequency signal at substantially a peak efficiency, said transistor having a collector circuit connected to a first impedance matching network, and a base circuit connected to receive said radio frequency signal;

a second transistor for amplifying said radio frequency signal at substantially a peak efficiency, said second transistor having a collector circuit connected to a second impedance matching network, and a base circuit connected to receive said radio frequency signal;

an output impedance matching network connected to said first and second impedance matching networks, and to an load impedance;

a base control circuit for selectively enabling one or both of said transistor base circuits to amplify said radio frequency signal at a peak efficiency, whereby one or more of said transistors is enabled to amplify said radio frequency signal; and a decoupling element connected between said first and second impedance matching networks, wherein said transistors are decoupled when one of said transistors is amplifying said signal, so that each amplifying transistor has a collector which sees substantially the same impedance whether one or more transistors are enabled to amplify said radio frequency signal.

2. The multiple power level radio frequency amplifier according to claim 1 wherein said first and second impedance matching networks comprise multiple sections of a series inductor terminated with a capacitor.

3. The multiple power level radio frequency amplifier according to claim 2 wherein said decoupling element is connected between first and second sections of said first and second matching networks.

4. The multiple power level radio frequency amplifier according to claim 3 wherein said decoupling element is a resistor.

5. The multiple power level radio frequency amplifier according to claim 1 wherein said first and second impedance matching circuits provide an impedance to each collector of said transistors which optimizes the amplification linearity of said transistor.

6. The multiple power level radio frequency amplifier according to claim 1 wherein said bias means provides a base current to a transistor which is not enabled so that said collector impedance remains substantially the same as when said transistor is enabled to amplify said radio frequency signal.

7. The multiple power level radio frequency amplifier according to claim 1 wherein said base control circuit provides for a radio frequency switch which is enabled to conduct said radio frequency signal to a base of a respective transistor when said transistor is in the amplifying state.

8. The multiple power level radio frequency amplifier according to claim 1 wherein said output impedance matching network comprises at least one series inductor serially connected to said first and second impedance matching networks and having a shunt capacitor connected to a second end of said series inductor and to said load impedance.

9. The multiple power level radio frequency amplifier according to claim 1 wherein said load impedance is an antenna.

10. A multiple power level radio frequency amplifier comprising:

a plurality of amplifying transistors for amplifying a common radio frequency signal;

means for applying an operating voltage between collectors of said transistors and emitters of said transistors;

means for selectively applying a signal for amplification to one or more of the base connections of each of said transistors wherein one or more of said transistors amplify said common radio frequency signal;

a plurality of matching networks connected to a collector of each of said amplifying transistors; said matching networks having output terminals connected together; a decoupling element connected between said matching networks, wherein said decoupling element reduces any change in impedance to each collector when one of said transistors is switched from an amplifying state to a non-amplifying state; and a load impedance network connected to an output terminal of said plurality of matching networks for matching a load impedance to said plurality of matching networks.

11. The multiple power level radio frequency amplifier according to claim 10 wherein a bias means maintains a biasing current to any one of said transistors when said transistors are not amplifying said radio frequency signal to establish a collector impedance which is substantially the same as said collector impedance when said transistor is amplifying said radio frequency signal.

12. The multiple power level radio frequency signal amplifier according to claim 11 wherein said matching networks comprise first and second serially connected LC filter sections, a first of said filter sections comprising an inductor having one end connected to said transistor collector, and a capacitor connected to said inductor remaining end and to a common connection formed by said transistors' emitter connections.

13. The multilevel power level radio frequency signal amplifier according to claim 12 wherein said decoupling element connects the junction of each of said serially connected LC sections of said matching networks for decoupling a transistor which is not amplifying said signal to one that is amplifying said signal, whereby the impedance change seen by the collector of said transistor amplifying said signal is insubstantially affected by the state of said transistor which is not amplifying said signal.

14. The multilevel power level radio frequency signal amplifier according to claim 13 wherein said decoupling element is a resistor.

* * * * *